United States Patent [19]
Jeromin et al.

[11] Patent Number: 6,075,248
[45] Date of Patent: Jun. 13, 2000

[54] DIRECT RADIOGRAPHIC IMAGING PANEL WITH SHIELDING ELECTRODE

[75] Inventors: Lothar S. Jeromin, Newark, Del.; Denny L. Y. Lee, West Chester, Pa.; Kelly Golden, Bear, Del.

[73] Assignee: Direct Radiography Corp., Newark, Del.

[21] Appl. No.: 09/177,150

[22] Filed: Oct. 22, 1998

[51] Int. Cl.[7] ................................................ G01T 1/24
[52] U.S. Cl. .............................. 250/370.09; 250/370.08
[58] Field of Search ......................... 250/370.09, 370.08, 250/580, 374, 370.14

[56] References Cited

U.S. PATENT DOCUMENTS

| | | | |
|---|---|---|---|
| 5,168,160 | 12/1992 | Jeromin et al. | 250/327.2 |
| 5,254,480 | 10/1993 | Tran | 437/2 |
| 5,315,101 | 5/1994 | Hughes et al. | 250/208.1 |
| 5,319,206 | 6/1994 | Lee et al. | 250/370.09 |
| 5,381,014 | 1/1995 | Jeromin et al. | 250/370.09 |
| 5,500,534 | 3/1996 | Robinson et al. | 250/385.1 |
| 5,610,403 | 3/1997 | Kingsley et al. | 250/370.09 |
| 5,648,660 | 7/1997 | Lee et al. | 250/370.09 |
| 5,652,430 | 7/1997 | Lee | 250/370.09 |

*Primary Examiner*—Seungsook Ham
*Assistant Examiner*—Richard Hanig
*Attorney, Agent, or Firm*—Ratner & Prestia

[57] ABSTRACT

An image capture panel including a substrate with a plurality of radiation detection sensors, a plurality of conductors connected one to each radiation detection sensor, a plurality of amplifiers connected to the sensors all on the substrate, and a field electrode having an peripheral edge mounted above the radiation detection sensors and the conductors. A shielding electrode may surround the field electrode peripheral edge or may completely cover the field electrode with a dielectric layer in-between. A shielding electrode may instead surround or completely cover each amplifier. The shielding electrode may be biased to ground via a resistor, and may be constructed of a conductive paint, such as silver paint.

18 Claims, 4 Drawing Sheets

DIRECT RADIOGRAPHIC IMAGING PANEL WITH SHIELDING ELECTRODE

TECHNICAL FIELD

This invention relates to radiation detection panels comprising a plurality of radiation sensors mounted beneath a field electrode and associated readout electronic elements outside the field electrode, and more particularly to a radiation detection panel which includes a shielding electrode protecting the readout electronics.

BACKGROUND OF THE INVENTION

Imaging radiation panels for detecting imagewise intensity modulated radiation such as x-ray radiation and for producing an electronic signal representing the image in the modulated radiation which may be digitized, stored, computer enhanced and subsequently displayed as a visible image in a number of different display media are well known. Such panels include an array of a plurality of sensors able to convert incident radiation directly to an electrical charge indicative of the intensity of the incident radiation. Typically such sensors comprise a complex structure which includes a radiation detection element and a charge storage element. The radiation detection element may be a photodiode operating together with a scintillation layer to detect photons emitted when radiation strikes the scintillation layer and produce a charge proportional to the photon intensity, or it may be a photoconductor which produces electrical charges directly when exposed to radiation and a charge collecting electrode to collect such charges. The charges so produced are typically stored in some storage device, most often a charge storage capacitor. Typical such panels are described in, for example: Jeromin, U.S. Pat. No. 5,168,160; Lee, U.S. Pat. No. 5,319,206; Lee, U.S. Pat. No. 5,652,430; Jeromin et al. U.S. Pat. 5,381,014, Hughes et al. U.S. Pat. No. 5,315,101 and Tran, U.S. Pat. No. 5,254,480.

Regardless of the particular type of sensor used, be it a photoconductor type or a photosensitive layer, most panels also employ a field electrode which usually extends uninterrupted over all sensors to apply a biasing field to the individual sensors. Also regardless of the particular sensor type used, most panels include electronic circuitry for addressing each sensor and recovering the charge stored therein in a manner which permits an image reconstruction sensor by sensor, each sensor forming a picture element or PIXEL of the complete image. Again the most commonly elements used to address each sensor are MOSFET switches, and are constructed using thin film technology, thereby often being referred to as TFT switches.

Associated with the sensors are sensitive electronics in the form of a plurality of integrated circuit chips, usually integrating amplifiers which receive the charge from the sensors and amplify it to produce a usable electronic signal proportional to the stored charge generated by the incident radiation.

The amount of charge that forms the initial signal prior to amplification is exceedingly small. The amplifiers are therefore most often placed as close as possible to the sensors, which in practical terms means along the panel edges right next to the beginning of the outermost column and line of the sensor array. As was stated previously, in most structures the sensor array is covered by the field electrode, which is co-extensive with the sensor array perimeter. Therefore the amplifiers tend to be in very close proximity to this field electrode. Depending on the sensor exact nature and the mode of operating the panel, a biasing voltage is applied to this field electrode and this biasing voltage may be raised to quite high levels. When this voltage is high, the amplifiers are susceptible to current leakage between the field electrode and the amplifier input and occasionally to voltage breakdown between the field electrode edge and the amplifier input leads. Typically the detector is enclosed in a container. The field electrode may generate ionized air that is confined by the container and that can drift over the amplifiers. The input signal to the amplifier may thus receive a noise spike or other noise signals. Such noise spikes or signals show on the image as a series of lines that are unacceptable to consumers of the radiation detection panels because the lines tend to obscure the actual image.

It is an object, therefore, of the present invention to provide a panel comprising a plurality of sensors, of the type which includes a field electrode, capable of creating an image that is substantially free of unacceptable noise lines.

SUMMARY OF THE INVENTION

In accordance with this invention, there is provided an image capture panel comprising:

a substrate a radiation detection layer over the substrate;

a field electrode over the radiation detection layer, the field electrode having an edge;

an electric ground; and a shielding electrode extending along said edge and electrically separate therefrom, said shielding electrode electrically connected to said electric ground.

The radiation detector panel will typically her include an electronic signal detection element on said substrate adjacent said field electrode edge. The shielding electrode is then located between the signal detection element and the field electrode edge. Also in most embodiments of this invention, the shielding electrode also extends completely around the field electrode edge.

The shielding electrode is preferably biased to ground via a resistor, and may be constructed of a conductive paint, such as silver or graphite paint.

BRIEF DESCRIPTION OF THE DRAWINGS

The invention can be more fully understood from the following description thereof in connection with the accompanying drawings described as follows.

DETAILED DESCRIPTION OF INVENTION

The invention will next be illustrated with reference to a specific panel which employs sensors that convert incident x-ray radiation to an electrical charge and store the charge in a charge storage capacitor. Such type of sensor is described in more detail in co-pending application Ser. No. 08/987,485 filed Dec. 9, 1997 now U.S. Pat. No. 6,025,599 in the names of D. L. Y. Lee, L. Cheung and L. Jeromin and assigned to the assignee of the present invention, the contents of which are incorporated herein by reference. The invention will also be illustrated with reference to the figures wherein similar numbers indicate the same elements in all figures. Such figures are intended to be illustrative rather than limiting and are included herewith to facilitate the explanation of the apparatus of the present invention.

Figure 1:
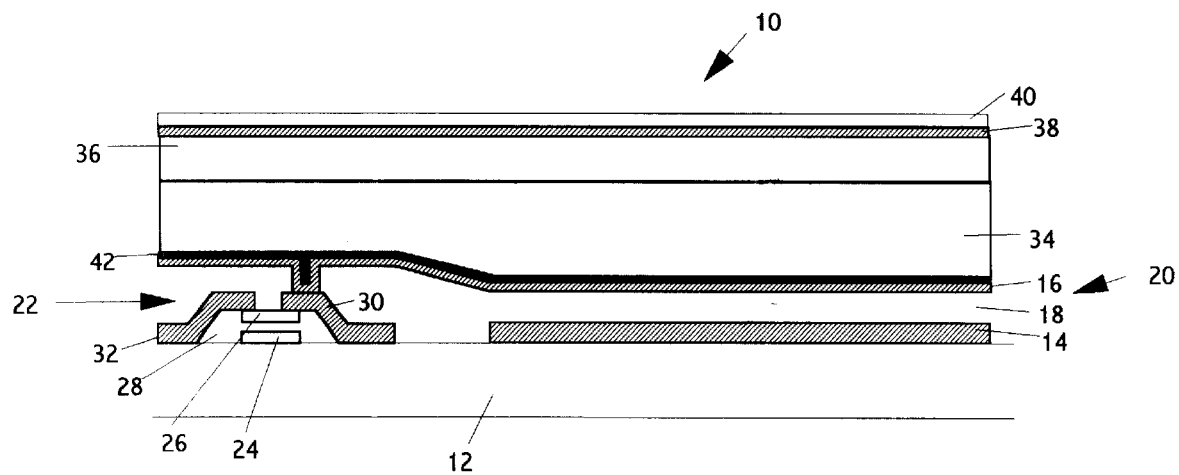
FIG. 1 is a schematic elevation of a radiation sensor used with the present invention.

Referring now to FIG. 1, there is shown in schematic cross section elevation representation the internal structure of a sensor 10 according to this invention. The sensor 10 is built on a substrate 12 which may be glass, ceramic, or other suitable insulating material which provides enough mechanical strength to support the layers and circuitry comprising the sensor.

Also shown are two conductive elements, placed adjacent each other to form a first or bottom conductive microplate 14, and a second, or middle, conductive microplate 16. A first dielectric layer 18 is placed between the two microplates. The two microplates and the dielectric layer form charge-accumulating capacitor 20. The conductive elements may be thin layers of a conductive material such as indium-tin-oxide, or a thin layer between 50A and 100A of metal.

An FET transistor 22 is also built on the substrate 12. Typically this transistor has a gate electrode 24, a gate oxide coating 26, and a semiconductive material 28 such as amorphous silicon. The gate electrode is connected to a conductor extending along the sensor. This conductor permits access to the gate permitting addressing the PET gate from outside the detector to switch the FET on or off at will. The FET also comprises a source and, a drain electrode. The source electrode 30 is connected to the second conductive microplate 16 and the drain electrode 32 is connected to a conductor (not shown) leading to a contact for connecting the sensor to a charge detector or amplifier.

A radiation detection layer which is typically a photoconductive layer 34, and which preferably exhibits very high dark resistivity, overlays the previously deposited layers. In radiography, particularly in medical applications, the incident radiation is X-ray radiation, and the radiation detection layer is an X-ray photoconductor. The photoconductive layer may comprise amorphous selenium, lead iodide, lead oxide, thallium bromide, cadmium telluride, cadmium sulfide, mercuric iodide or any other such material. It may comprise organic materials such as polymers that may be loaded with X-ray absorbing compounds that exhibit, photoconductivity when the captured radiation is X-ray radiation.

In a preferred embodiment, this layer is a continuous amorphous selenium layer 300 to 500 micrometers thick.

A second dielectric layer 36 is placed over the photoconductive layer, a conductive field electrode 38 is placed over the second dielectric layer, and a third dielectric layer 40 is placed over the field electrode 38. Field electrode 38 is preferably a layer of indium-tin-oxide; other conductive material such as chromium, aluminum, etc. may be used. The field electrode should be selected so that it is substantially transparent to the radiation one wishes, to detect. When such radiation is X-ray radiation the field electrode is preferably a conductive layer which is highly penetrable by such radiation.

A programmable power supply 60 (shown in FIG. 2) is used to apply a charging voltage to the sensor. The power supply is connected to the field electrode 38 and to the bottom microplate 14 of the storage capacitor. Typically the bottom microplate is connected to an electrical common point for the circuit, usually a ground 62.

In a preferred embodiment, the middle microplate 16 extends over the FET and an insulating layer 42, such as a SiOx layer, preferably $SiO_2$, is placed between the middle microplate 16 and the photoconductor layer 34.

The technology for creating the sensors is preferably vacuum deposition of alternating layers of conductive, dielectric and insulating materials, and is well known in the art. See for instance "Modular Series on Solid State Devices" Volume 5 of Introduction to Microelectronics Fabrication by R. C. Jaeger, published by Addison-Wesley in 1988.

Figure 2:
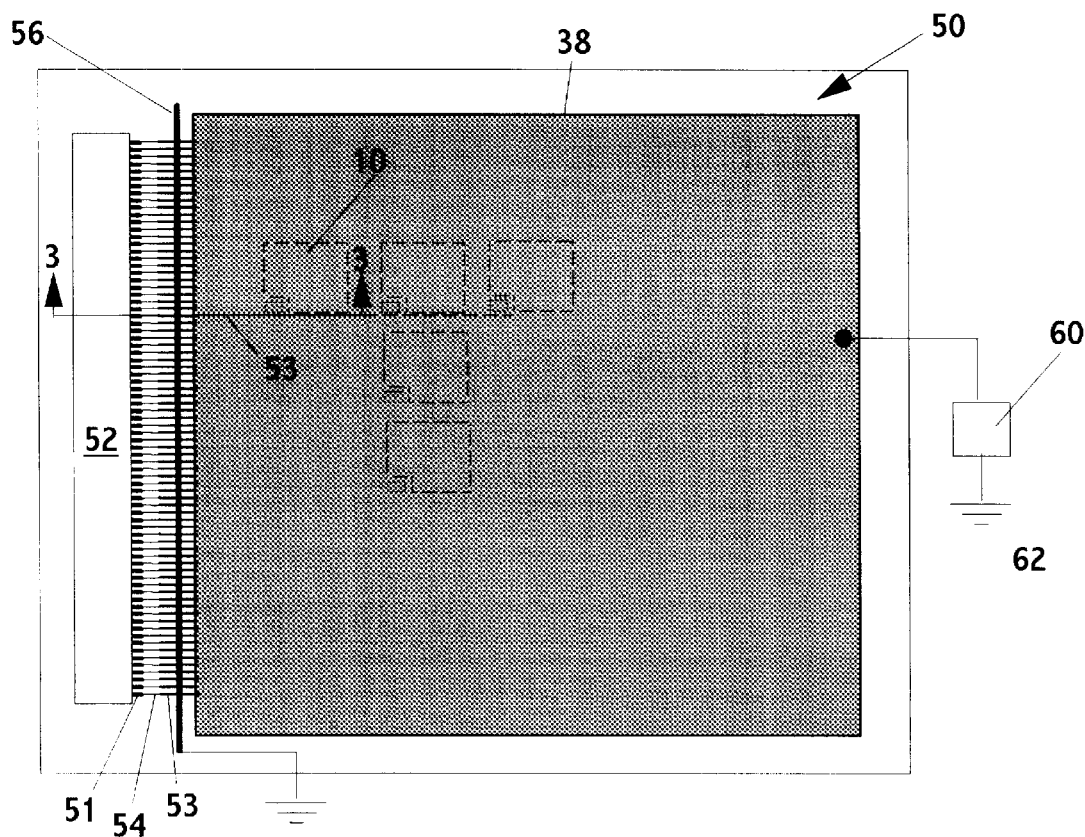
FIG. 2 shows a radiation detection panel wherein the shielding electrode extends along one side of the field electrode only.

Referring now to FIGS. 2–9, there are shown a number of views illustrating the configuration of components in accordance with specific embodiments of the present invention. A plurality of sensors 10 may be arrayed on a supporting structure 50 to provide an imaging panel capable of capturing radiation produced images, as shown in FIG. 2. Each of the sensors forms a PIXEL, or picture element. Such a panel may be made as a single unit or may be a composite of a plurality of smaller panels to achieve a desired size. The aforementioned U.S. Pat. No. 5,381,014 issued to Jeromin et al. on Oct. 8, 1996 discloses a technique for making larger panels using smaller units.

Figure 8:
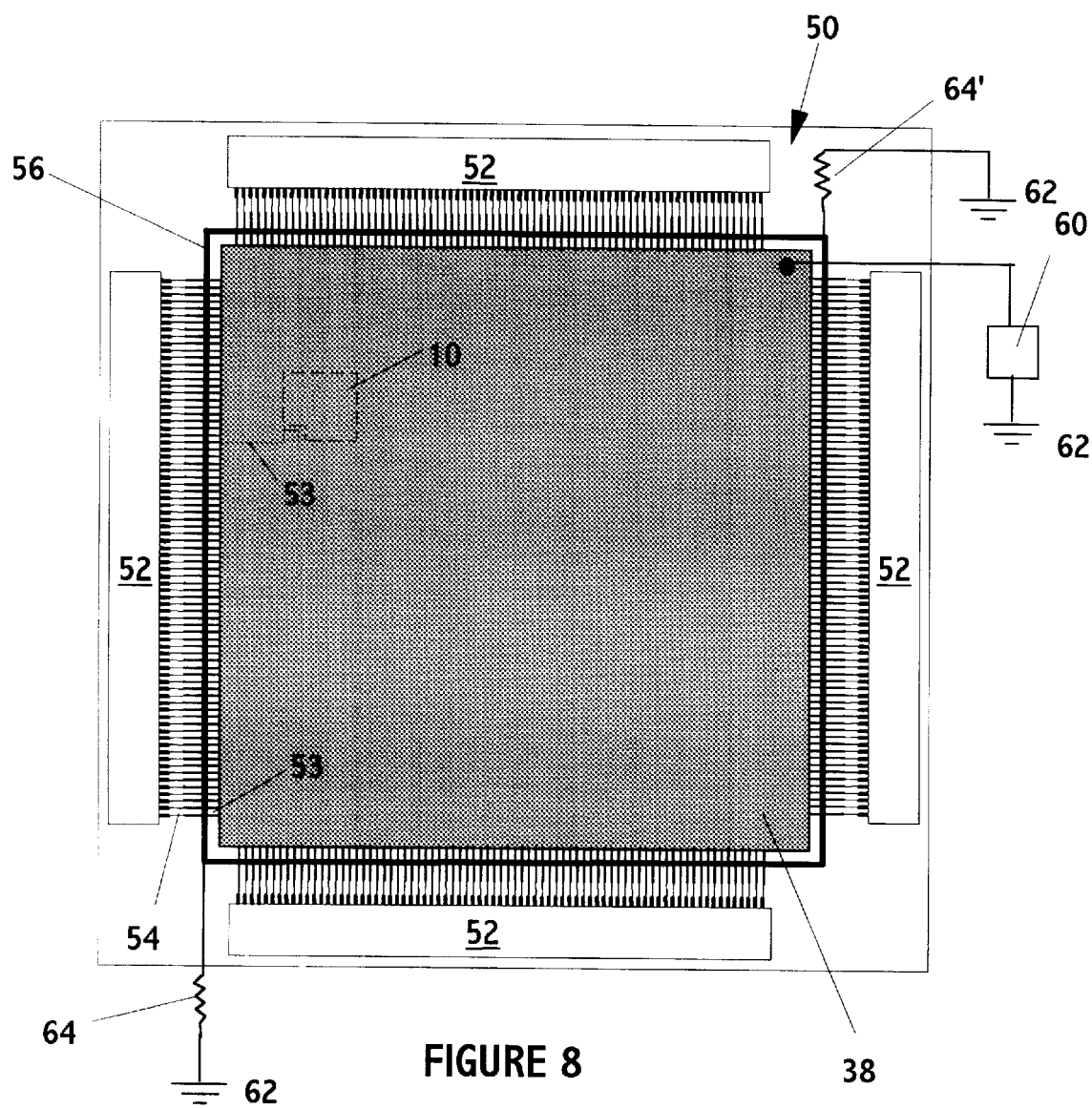
FIG. 8 shows a radiation detection panel in accordance with the present invention wherein the shielding electrode extends all around the field electrode.

A plurality of conductors 53 (only a portion of which is illustrated) extend between tie sensors. Each pixel 10 in a row is electrically connected to an adjacent one of said conductors 53 through the FET in the sensor. Each conductor 53 is in turn connected to the signal input pads 51 of multi-channel amplifier 52 via contact 54, which may be in the form of a wire bond. A single amplifier 52 is generically shown on the side of the panel in FIG. 2, but it should be understood that each amplifier may comprise a plurality of integrated circuit chips. According to one embodiment of this invention, a shielding electrode 56 is placed all along an edge 58 of the field electrode 38, between the amplifiers 52 and the field electrode edge closest to the amplifiers. The shielding electrode 56 is electrically insulated from the conductors 53 and is preferably sandwiched between second dielectric layer 36 and the third dielectric layer 40. In cases where there are amplifiers and corresponding leads extending all around the perimeter of the field electrode, as shown in FIG. 8, the shielding electrode 56 completely surrounds the periphery of field electrode 38.

Although the term "shielding" electrode is used throughout this description to refer to various embodiments, the electrode may prevent the unacceptable noise lines on the resulting image by one or more mechanisms that may be more properly characterized as shielding, guarding, or prevention. Shielding often implies providing a barrier that encapsulates the source and/or destination of the spurious charge, and prevents signal influence by spurious charge migration and external fields or radiation. Guarding often implies acting as an antenna to provide a more attractive destination for the spurious charge than the destination being guarded. Prevention denotes schemes that inhibit creation of the offending electrical influences. "Shielding electrode" is used herein generically to refer to the electrode of the present invention that prevents the unacceptable noise lines by one or more of the above mechanisms, which may or may not include shielding as defined above.

Guards, in particular, are most effective when they are exactly, or at least approximately, at the same potential as the signals they protect, particularly if they are located very near the circuitry being protected. The most sensitive portions of circuitry being protected in the present invention are the signal inputs (contacts 54) for amplifiers 52, typically biased at relatively low voltage (for example+5 volts). Because this low voltage is very close to ground, especially when compared to the thousands of volts applied to some of the nearby circuitry, it may be practical and acceptable to connect the various shielding electrode embodiments disclosed herein to ground. It may be preferable, however, to supply connection points, such as dedicated amplifier signal input connector pads, biased at the more precise amplifier reference voltage for connection of the shielding electrode. This type of connection is described in detail with reference to a specific embodiment, below, but is applicable to all the shielding electrode embodiments described herein.

The shielding electrode may be connected to a resistor. Providing resistance in the connecting circuitry may limit current during faults, such as sparks or flash-over. In addition, resistance may dampen transients, and eliminate or at least mitigate overshoot and ringing. The wiring materials for connecting to the shielding electrode may be strategically selected to introduce the desired resistance, thus avoiding extra components.

Figure 3:
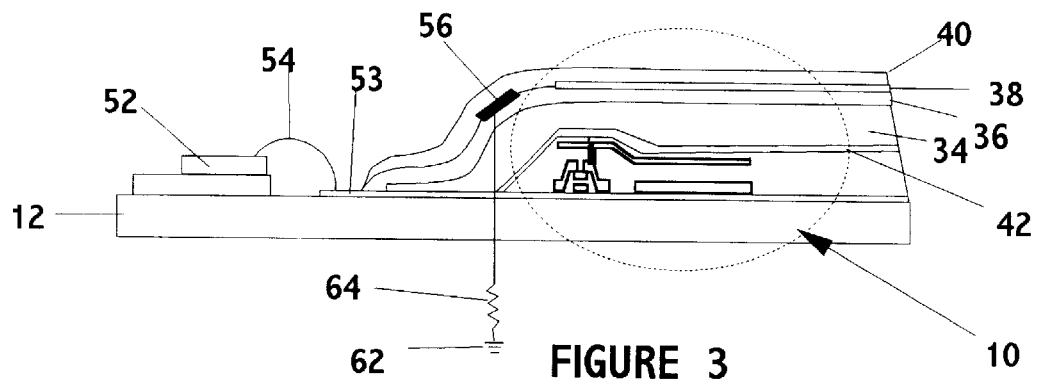
FIG. 3 shows a cross section along arrows 3—3 of the radiation detection panel of FIG. 2 showing the shielding electrode of the present invention placed along the photoconductor layer side.

FIG. 3 illustrates a panel having a preferred placement of the shielding electrode 56, which as shown is on the normally sloping side of the photoconductor layer. The shielding electrode is typically about 1 mm wide. To avoid excessive current leakage between the field electrode and the shielding electrode, a gap of about 1 mm is maintained between field electrode 38 and shielding electrode 56. Shielding electrode 56 is interposed between field electrode 38 and conductors 53. Thus, shielding electrode 56 captures any current leakage whether direct or from ionized air adjacent the panel surface, rather than such current leakage being picked up by the amplifier and resulting in unacceptable noise lines on the image. In this sense, shielding electrode 56 operates both as a guard, because it attracts spurious charge better than the more distant signal inputs to amplifier 52, and a shield, because it is directly in the preferred path of surface-charge movement.

Figure 4:
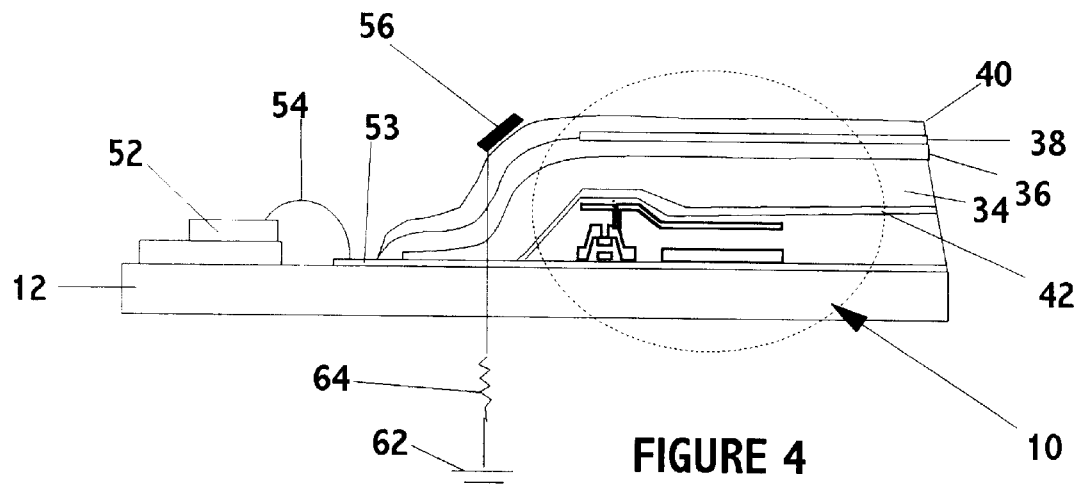
FIG. 4 shows a schematic elevation of an alternate embodiment of this invention wherein the shielding electrode is placed over the top dielectric layer over the field electrode.

In an alternate embodiment shown in FIG. 4, the shielding electrode 56' may be located on top of the third dielectric layer 40. When so located, shielding electrode 56' acts primarily as an antenna-like guard capturing aerial (floating) spurious charge.

Figure 5:
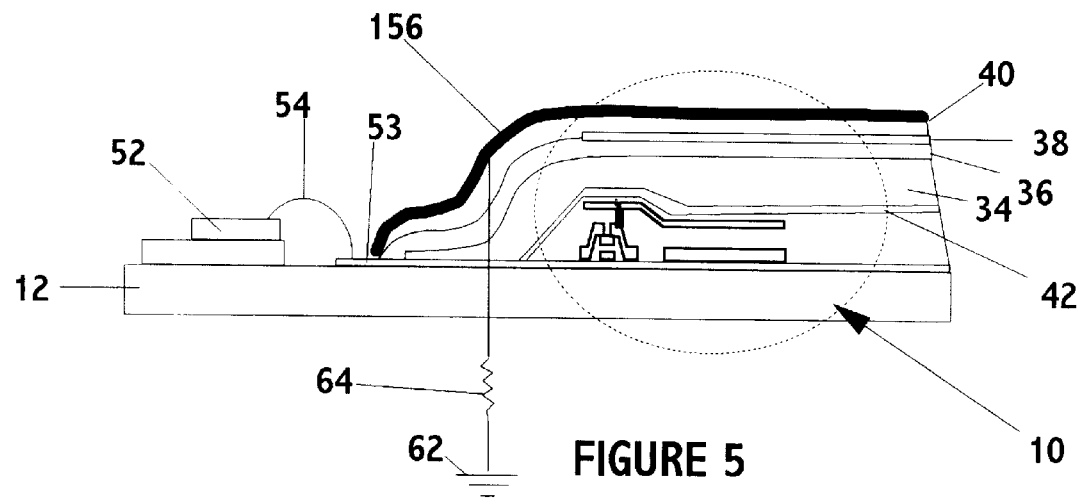
FIG. 5 shows a schematic elevation of an alternate embodiment of this invention wherein the shielding electrode completely covers the portion of the top dielectric layer directly over the field electrode.

In another embodiment, shown in FIG. 5, shielding electrode 156, rather than being a ring around field electrode 38, completely covers dielectric layer 40 or at least that portion of dielectric layer 40 directly over field electrode 38. In addition to shielding and guarding against such current leakage, shielding electrode 156 may prevent such current leakage by inhibiting high-voltage external fields that influence at a distance and generate spurious charge. Such a shielding electrode 156 may be constructed by a vacuum deposition process.

Figure 6:
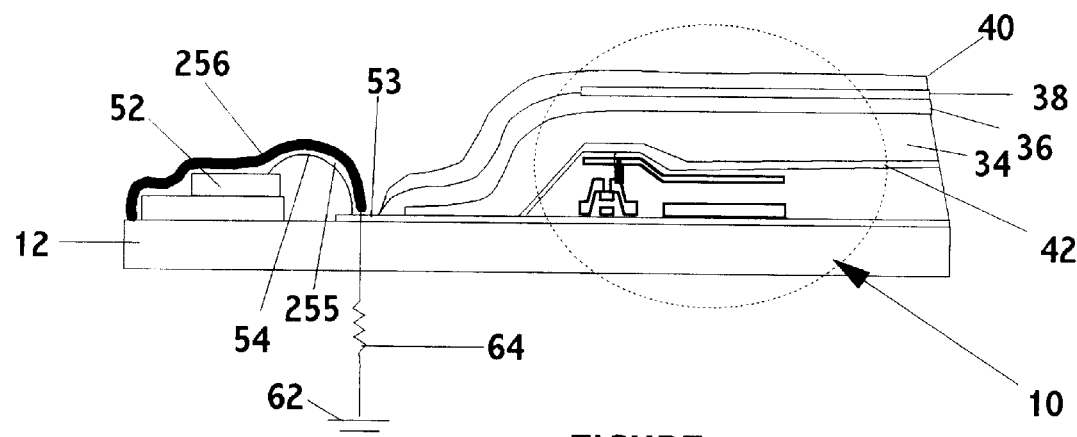
FIG. 6 shows a schematic elevation of an alternate embodiment of this invention wherein the shielding electrode conformally covers the amplifier chip and associated contacts.

Rather than having a single shielding electrode over the field electrode 38, there may be a plurality of shielding electrodes 256, each completely covering an amplifier chip 52 and its associated contacts 54, as shown in FIG. 6. Such a shielding electrode 256 may be constructed as a conformal coating over a dielectric layer 255 directly over the chips 52 and contacts 54, and may act both as a shield as well as a guard against substrate surface leakage and aerial charge.

Figure 7:
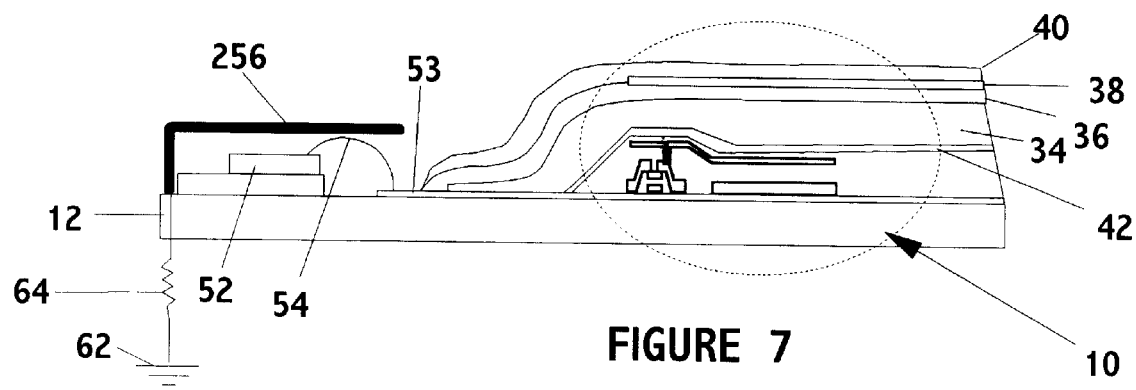
FIG. 7 shows a schematic elevation of an alternate embodiment of this invention wherein the shielding electrode covers the amplifier chip and associated contacts but has an open end adjacent the contacts.

In an alternate embodiment, shown in FIG. 7, shielding electrode 256' may be a stand-alone, box-like structure having an open end 258 adjacent contacts 54, and may function merely as a guarding antenna.

As shown in FIG. 8, shielding electrode 56 (as well as 56', 156, 256, or 256') is connected to ground 62, preferably via a resistor 64. In a preferred embodiment, as shown in FIG. 4, two resistors, 64 and 64' are used on diametrically opposing corners of the panel providing two grounding paths rather than one. Typical resistor values are 10 kΩ to 200 kΩ, but other sizes may also be adequate depending on the application, panel structure, and voltages involved.

Figure 9:
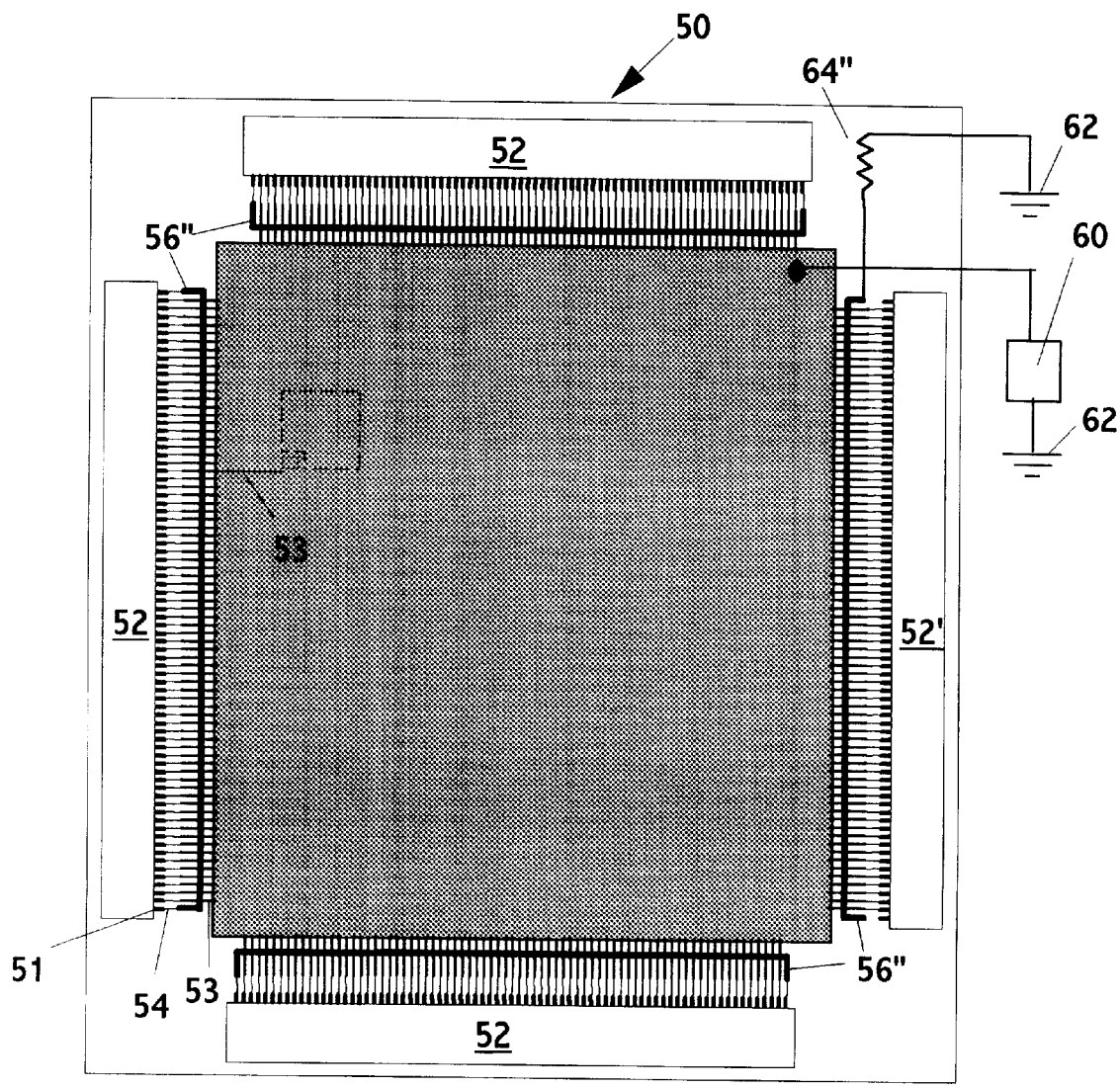
FIG. 9 shows a radiation detection panel in accordance with the present invention wherein a shielding electrode extends around each amplifier and integrator chip.

Finally, in yet another alternate embodiment, as shown in FIG. 9, the shielding electrode may be in the form of a shield conductor 56" associated with amplifier 52. In such an embodiment, each signal conductor 53 may terminate adjacent to an amplifier 52 signal input connector pads 51. Typically such conductors are formed using microlithographic processes well known in the art, on supporting structure 50. Shield conductor 56" is electrically isolated from the signal conductors 53, and is interposed between the field electrode 38 edge and the paths of the signal conductors 53. Shield conductor 56" terminates adjacent to amplifier 52, and may thus be wirebonded to corresponding shield conductor input pads 51 on the amplifier as shown, for each amplifier 52 in FIG. 9 in the same way as conductors 53 connected to sensors 10 are wirebonded to the amplifier. The pads 51 to which shield conductor 56" is connected may be merely dummy pads biased at the amplifier reference voltage. This connection scheme may be applied to any of the various shield electrode embodiments disclosed herein. Alternatively, the shield conductor 56" may merely be connected directly to ground 62 or via a resistor 64" as shown for amplifier 52' in FIG. 9. Where there are a plurality of integrated circuit chips that make up a larger "hybrid" circuit chip, there may be a separate shield conductor 56" for each chip or for each hybrid chip.

In a preferred embodiment, the material of the shielding electrode comprises a conductive paint that can be applied with a syringe-type dispenser. Silver paint has demonstrated especially good conduction, but other conductive paints, such as graphite paint, may also be used. In the alternative, the shielding electrode may comprise a thin line of conductive paste, or may be a printed or photolithographically-formed electrode.

More than one of the aforementioned embodiments may be used together, as necessary. The embodiments described herein are only intended for illustration, without limitation, of some of the ways that the sensitive electronics of an image capture panel can be shielded or guarded from leakage currents. Many other embodiments of a similar nature can be envisioned, and are to be construed as being encompassed within the scope of the present invention.

In the particular panel embodiment used for illustrating this invention, the panel is first charged by applying a charging voltage between the field electrode and the bottom microplates. The panel is then exposed to radiation that carries image information as a modulated intensity. The radiation impinges on the panel for a preset duration, and charges proportional to the radiation intensity are generated and stored in the storage capacitors. Appropriate signal processing, (preferably of the type disclosed in U.S. Pat. No. 5,648,660 issued to Lee et al.) is used to recover the accumulated charges in all of the storage capacitors in the detectors in the panel and to reconstruct a visible image. Any current leaking from the field electrode, and any current due to adjacent ionized air over the panel, is intercepted before it reaches the amplifiers, captured and directed to ground by the shielding electrode.

The invention has been described in detail with reference to a particular sensor type, however this was done for illustration purposes and is not intended to limit this invention to panels having this type of sensor only. As was initially stated the shielding electrode placed according to this invention is applicable whenever a field electrode or top electrode is used in a panel which is biased in a manner which produces leakage current which interferes with the signal detection. The exact nature of the underlying detector is not controlling. Those skilled in the art having the benefit of the teachings of the present invention as hereinabove set forth, can effect numerous modifications thereto. These modifications are to be construed as being encompassed within the scope of the present invention as set forth in the appended claims in which I claim:

1. An image capture panel comprising:
   a substrate
   a radiation detection layer comprising a plurality of radiation sensors over said substrate;
   a field electrode over said radiation detection layer, said field electrode having an edge;
   at least one electronic signal detection element on said substrate adjacent said field electrode edge;
   an electric ground; and
   a shielding electrode extending between said signal detection element and said field electrode along said edge and electrically separate therefrom, said shielding electrode electrically connected to said electric ground.

2. The image capture panel in accordance with claim 1 wherein said edge extends completely around said field electrode and wherein said shielding electrode also extends completely around said edge.

3. The image capture panel in accordance with claim 1 wherein the shielding electrode comprises a thin line of conductive paste.

4. The image capture panel in accordance with claim 1 wherein the shielding electrode comprises a thin line of conducting silver paint.

5. The image capture panel in accordance with claim 1 wherein the shielding electrode comprises a photolithographically-formed electrode.

6. The image capture panel in accordance with claim 1 wherein the shielding electrode comprises a printed electrode.

7. The image capture panel in accordance with claim 1 wherein the radiation detection layer also comprises a radiation sensitive layer over said plurality of radiation sensors, said radiation sensitive layer having a side, and a dielectric layer thereover, and wherein the field electrode edge does not extend over said side and the shield electrode is over said dielectric layer on said side.

8. The image capture panel according to claim 1 comprising a photoconductive layer in said radiation detection layer, a first dielectric layer above said photoconductive layer, and a second dielectric layer above said first dielectric layer, wherein said field electrode is sandwiched between the first and second dielectric layers, and wherein said shielding electrode is placed over said second dielectric layer.

9. The image capture panel in accordance with claim 1 further comprising a dielectric layer over said shielding electrode.

10. The image capture panel according to claim 1 comprising a photoconductive layer in said radiation detection layer, a first dielectric layer above said photoconductive layer, and a second dielectric layer above said first dielectric layer, and wherein said field electrode and said shielding electrode are sandwiched between the first and second dielectric layers.

11. The image capture panel according to claim 1 wherein the shielding electrode has a width of approximately 1 mm.

12. The image capture panel according to claim 1 wherein the distance between the shielding electrode and the field electrode is approximately 1 mm.

13. The image capture panel according to claim 1 wherein the shielding electrode is connected to the electric ground with a resistor.

14. The image capture panel according to claim 13 wherein the resistor has a resistance of approximately between 10 and 200 kilo-ohms.

15. The image capture panel according to claim 1 wherein said shielding electrode extends over said field electrode.

16. The image capture according to claim 15 wherein the shielding electrode is co-extensive with the field electrode.

17. The image capture panel according to claim 1 further comprising a conductor leading from under the field electrode to the electronic signal detection element, wherein the shielding electrode extends over said electronic signal detection element.

18. The image capture panel according to claim 1 further comprising said at least one electronic signal detection element having a signal input connector pad, a shield connector pad, and a signal conductor leading from under the field electrode to the signal input connector, wherein the shielding electrode is connected to said shield connector pad and extends over the signal conductor.

* * * * *